United States Patent [19]

Trimberger

[11] Patent Number: 5,703,759
[45] Date of Patent: Dec. 30, 1997

[54] MULTI-CHIP ELECTRICALLY RECONFIGURABLE MODULE WITH PREDOMINANTLY EXTRA-PACKAGE INTER-CHIP CONNECTIONS

[75] Inventor: Stephen M. Trimberger, San Jose, Calif.

[73] Assignee: Xilinx, Inc., San Jose, Calif.

[21] Appl. No.: 569,032

[22] Filed: Dec. 7, 1995

[51] Int. Cl.$^6$ .................................................. H05K 7/02
[52] U.S. Cl. ...................... 361/777; 361/760; 361/728; 361/785
[58] Field of Search .................. 29/846; 174/52.1, 174/250, 253, 260, 261; 257/208, 209, 528, 529, 530, 678, 693, 697, 786, 777, 723, 727, 724, 726; 361/728, 679, 733, 748, 760, 777, 778, 820, 805, 803; 395/280, 281, 282, 284, 821, 822, 969; 439/68, 61, 59, 70, 71, 525; 364/514 C, 708.1, 709.08

[56] References Cited

U.S. PATENT DOCUMENTS

| | | | |
|---|---|---|---|
| 3,648,116 | 3/1972 | Baugher et al. | 361/728 |
| 4,727,268 | 2/1988 | Hori | 257/209 |
| 5,539,621 | 7/1996 | Kikinis | 361/803 |

OTHER PUBLICATIONS

"EPF8050M ASIC Prototyping Vehicle", Altera Corporation, San Jose, California, Jan. 1994, two pages.

*Primary Examiner*—Donald Sparks
*Attorney, Agent, or Firm*—Clifton L. Anderson; Edel M. Young

[57] ABSTRACT

An electrically reconfigurable multi-chip module (MCERD) comprises three electrically reconfigurable integrated circuits (ERICs) enclosed in a package. The package provides for more "extra-package" connections between the ERICs and package pins than it does "intra-package" inter-chip connections. However, configuration connections between ERICs are intra-package. The MCERD is mounted on a daughterboard which provides connections between package pins and between package pins and pins of the daughterboard. The connections between package pins define "extra-package inter-chip" connections that typically far exceed the number of intra-package inter-chip connections. The connections between package pins and daughterboard pins connect the MCERD to a host system when the daughterboard is mounted on the host system motherboard. When the MCERD and daughterboard are installed in a host system, the MCERD can be electrically configured and then operated as configured. A feature of this MCERD is that a system developer can configure the inter-chip connections by appropriate design of the daughterboard.

13 Claims, 3 Drawing Sheets

MULTI-CHIP ELECTRICALLY RECONFIGURABLE MODULE WITH PREDOMINANTLY EXTRA-PACKAGE INTER-CHIP CONNECTIONS

BACKGROUND OF THE INVENTION

The present invention relates to electrically reconfigurable integrated circuits and, more particularly, to multi-chip modules including such devices. A major objective of the present invention is to provide for an economical, high-performance, compact, large-capacity, and flexibly configurable electrically reconfigurable device.

Much of modern progress is associated with the increasing functionality and speed of integrated circuits. When produced in large quantities, integrated circuits are sufficiently inexpensive that computers, instruments, and consumer products incorporating them are within the reach of everyone. However, very high start-up costs, including research, manufacturing facilities, design, processing, and testing, can be prohibitive for small volume applications. Low volume runs are important, not only for certain specialized applications, but as intermediate steps in the development of integrated circuits eventually destined for large volume production. Various "application-specific integrated circuit" (ASIC) technologies have addressed the problem of start-up costs. However, because they involve reliance on further manufacturing to realize a design, start-up costs are higher than desired for many applications.

Where the desired functionality can be achieved, electrically configurable, i.e., programmable, devices, afford a very attractive approach to small volume integrated circuit manufacturing. An electrically configurable device has distinct configuration and operational modes; the functions implemented by the device during operational mode are determined by configuration data stored in the configuration memory of the device during configuration mode. Electrically configurable devices include both memory devices, e.g., programmable read-only memories (PROMs) and logic devices, e.g., programmable logic arrays (PLAs).

Electrically configurable device designs can be updated or improved and then implemented by a device replacement. Electrically reconfigurable devices (ERDs) can be electrically erased and reconfigured in circuit. The advantages of ERDs during iterative design stages is clear. Circuits can be updated readily using the same basic types of electrical components used during system operation.

A simple ERD system includes a PROM that stores configuration data while the system is off and an electrically reconfigurable integrated circuit (ERIC), the configuration of which determines system operation when it is on. Upon startup, data is transmitted from the PROM to the ERIC so that when booting is complete, the system is configured as desired. Reconfiguration can be implemented during system operation by a program that writes configuration data into random-access (writable) memory which is then read into ERIC configuration memory in the same manner that the original configuration data was. Reconfiguration can be used during an ERIC debugging routine or to provide different "personalities" for the host system.

More generally, an electrically reconfigurable device (ERD) can include one or more ERICs. A single-chip ERD includes an ERIC in a package that encloses and provides interfacing for the ERIC. ("Chip" is colloquial for "integrated circuit".) When the desired configuration requires more capacity than is provided by a single ERIC, multiple single-chip ERDs can be used. Typically, the multiple single-chip ERDs are daisy chained so that they can be serially configured. When an "upstream" ERD is filled to capacity with configuration data, any remaining configuration data is "overflowed" to "downstream" ERDs. In the prevalent "data-cascaded" ERD systems, configuration data is supplied to "downstream" ERDs through "upstream" ERDs.

The space consumed by multiple single-chip ERDs can be excessive. Because of the extra circuitry required to allow configuration the post-configuration functional of an ERIC is much less that of a functionally equivalent nonconfigurable integrated circuit. Thus, during development, many single-chip ERDs and one or more PROMs may be used in the place allocated to a single post-development integrated circuit. While there are many ways to accommodate an oversize ERIC assembly, more compact ERD systems would be far more convenient.

Multi-chip modules (MCMs) consist of a single package enclosing multiple integrated circuits. MCM packages provide for both intra-package inter-chip connections and extra-package external connections. The intra-package connections typically include conductive traces on and/or wires in the package that extend between input/output nodes of the packaged integrated circuits. The external connections are implemented by wires and/or traces that connect input/output nodes to pins or bonding pads of the package. These pins or bonding pads are used for electrical and physical interfacing of the package to a host system. To achieve tight functional coupling of the included integrated circuits, the inter-chip connections typically exceed the external connections.

For an example outside of the ERD art, the "Pentium Pro" or P6 processor from Intel is an MCM with a microprocessor integrated circuit and a cache integrated circuit in a single package. The MCM implementation allows the cache to be larger than it would be if implemented on the same integrated circuit as the microprocessor, but more closely coupled to the microprocessor than it would be if implemented in a separated integrated circuit package. Thus high cache capacity and high cache performance are achieved using the MCM approach.

MCMs can provide for multi-chip electrically reconfigurable devices (MCERDs). A predetermined allocation of ERIC input/output (I/O) nodes between inter-chip and external connections may not match the needs of a system developer. In line with the configurability of the ERD, it is desirable not only that the individual ERICs be configurable, but also that the connections between the ERICs be configurable. To this end, an "EPF8050M" MCERD supplied by Altera Corporation of San Jose, Calif., includes a configurable routing chip in the MCERD. The external conductors (pins or pads) and input/output nodes of the ERICs are coupled to I/O nodes of the routing chip. Configuration of the routing chip determines the internal connections between its input/output nodes. Thus, the allocation of ERIC I/O nodes between inter-chip and external connections can be made by the system developer.

One disadvantage of the configurable routing chip is the cost it adds to the MCERD. The routing chip must include a large number of I/Os, but adds no usable logic. Thus, its inclusion in an MCERD adds considerable cost, without adding functionality.

In addition, the routing adds delays to signals even during operational mode of the MCERD. For example, operational signals can routed through multiple pass gates: the resulting delay can be about 25 nanoseconds, typically. If the MCERD is used in a production device, performance can be less than desired. If the MCERD is replaced by an integrated circuit that is not subject to the same delays, the system developer may be faced with new timing problems once the integrated circuit is manufactured and installed. These problems could require further development work, diminishing the primary utility of the MCERD. Finally, an MCERD must be designed with a predetermined maximum number of I/Os. This maximum number is less than the sum of the I/Os for all ERICs, and may be too few for some applications.

What is needed is a more economical and higher-performance MCERD. These objectives should be achieved while providing flexibility to the system developer to determine the assignment of ERIC I/O nodes to inter-chip and to external connections.

SUMMARY OF THE INVENTION

The present invention provides an MCERD in which the number of the ERIC I/O nodes in extra-package connections exceeds, preferably by at least an order of magnitude, the number of such nodes in intra-package connections. The MCERD package can be mounted on a circuit board that determines which package I/O nodes are used for external connections and which package I/O nodes are coupled to each other. Inter-chip connections can be made extra-package through this external connection of package I/O nodes. To provide for flexible configuration of inter-chip connections, the number of ERIC I/O nodes in extra-package inter-chip connections exceeds the number of ERIC I/O nodes in intra-package inter-chip connections.

The printed circuit board can be a daughterboard that can be mounted on a motherboard of a host system. Preferably, the daughterboard has pins than can be inserted in a zero-insertion-force (ZIF) socket of the motherboard for ready replacement. The daughterboard can provide physical inter-facing even where the number of pins in the MCERD package does not match the number of holes in the motherboard socket. It can also be advantageous for the daughterboard to have its own ZIF socket for the MCERD. Alternatively, the daughterboard can be omitted and the extra-package inter-chip connections can be provided by the motherboard itself.

Inter-chip connections that govern the configuration cascade for daisy-chained ERICs are preferably intra-package inter-chip connections. In a data-cascade system, the series of cascade connections includes configuration data lines that convey configuration data from respective upstream ERICs to respective downstream ERICs for storage in their respective configuration memories. In an enable-cascade system, the series of cascade connections convey "done" signals from upstream ERICs to "configuration active" inputs of respective downstream ERICs, while configuration data is broadcast to all ERICs. In either case, the configuration data is supplied to a first ERIC via an extra-package external connection. To maximize connection flexibility, information bearing intra-package connections can be limited to those e.g., cascade lines, used only during configuration mode. Other than these, intra-package connections are limited to constant voltage, e.g., power and ground, and periodic, e.g., clock, lines.

The method of the invention involves assembling the specified MCERD. The MCERD can be mounted on a circuit board to define most of the inter-chip connections as well as the external connections. The circuit board can be a daughterboard that provides physical and electrical interfacing between the MCERD and a motherboard of a host system. Once the MCERD is physically installed, the ERICs can be configured. Once it is configured, the MCERD can be operated in the context of the host system.

Conceptually, the present invention deviates from the prior art MCMs in that the inter-chip connections are predominantly extra-package rather than predominantly intra-package. The prior art uses relatively large numbers of intra-package inter-chip connections to provide high levels of integration; the present invention uses a large number of extra-package connections to allow flexible configuration of the inter-chip connections. The large number of extra-package connections in the inventive MCERD allows a system developer to determine the assignment and allocation of ERIC I/O nodes to inter-chip and external connections.

This determination can be implemented by design of a daughterboard, which can be made quite inexpensively. Furthermore, since the daughterboard also serves to accommodate pin-count mismatches between an MCERD and a motherboard, the marginal cost of using a daughterboard for inter-chip connections can be extremely low. While the resulting extra-package inter-chip connections are longer than corresponding hard-wired, intra-package inter-chip connections would be, they are faster than intra-package inter-chip connections made through a routing chip. Thus, higher performance is achieved in the context of a flexibly routable MCERD.

If a system developer requires different inter-chip connections, these can be achieved by replacing the daughterboard. While this is not as convenient as reconfiguring an electrically reconfigurable routing chip, it is anticipated that the frequency with which the inter-chip connections are required can be much less than the frequency with which the ERICs will be reconfigured. In most cases, the inconvenience is outweighed by the cost and performance advantages of the present invention. Where electrical routing reconfiguration is desired, an electrically reconfigurable routing chip can be included on the daughterboard (rather than in every MCERD).

Thus the present invention provides an ERD in an MCM format for compactness. Extra-package inter-chip connections provide routing flexibility. The routing flexibility can be achieved without a specialized routing chip so that costs are reduced and performance is enhanced. These and other features and advantages of the present invention are apparent from the description below with reference to the following drawings.

DESCRIPTION OF THE PREFERRED EMBODIMENTS

Figure 1:
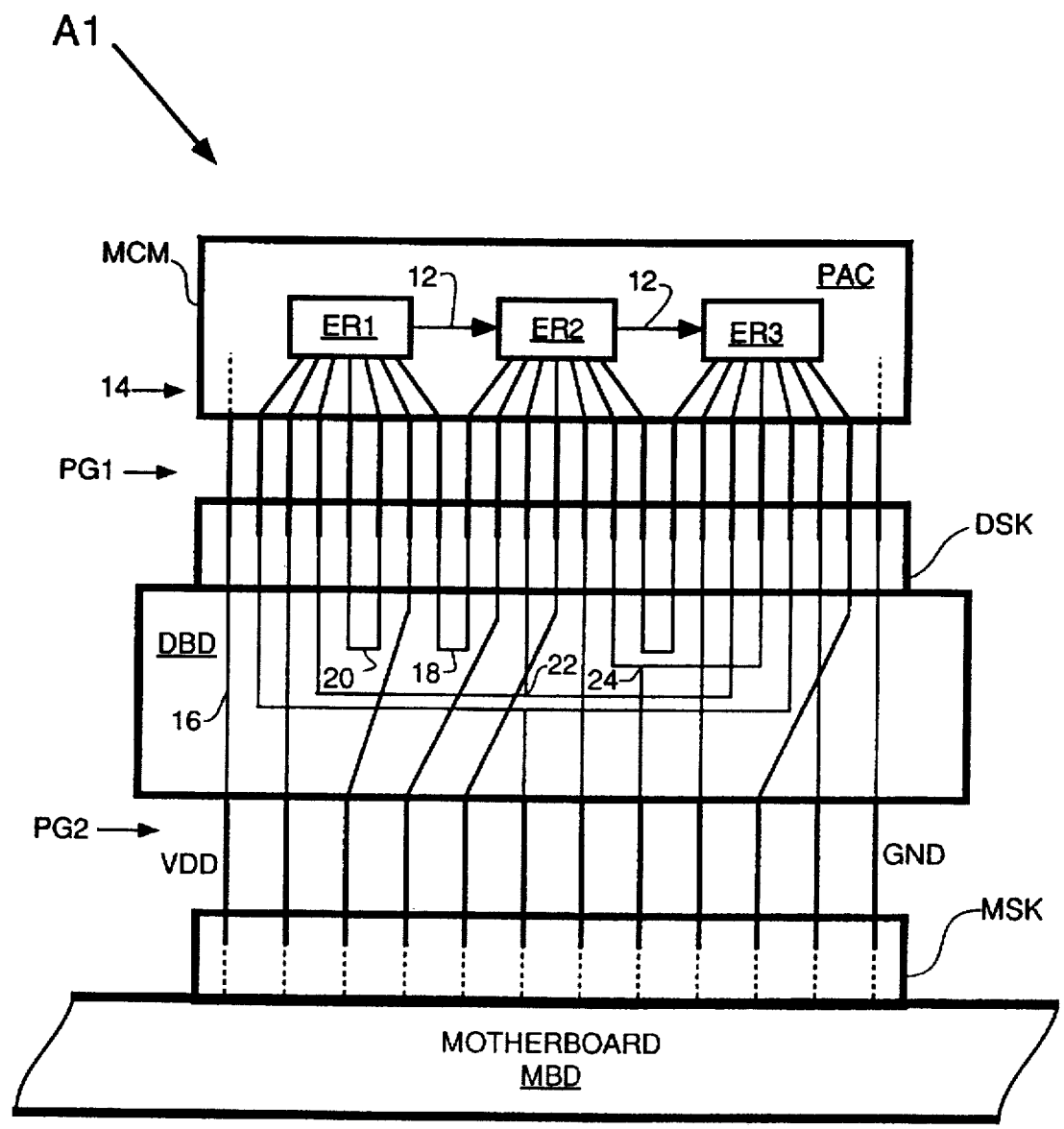
FIG. 1 is a schematic diagram of an MCERD system in accordance with the present invention.

In accordance with the present invention, an MCERD system A1 includes a host-system motherboard MBD with a ZIF socket MSK, a daughterboard DBD with a ZIF socket DSK, and a multi-chip module MCM, as shown in FIG. 1. Multi-chip module MCM includes a ceramic package PAC that encloses three ERICS ER1, ER2 and ER3. Package PAC provides for "intra-package" inter-ERIC connections 12 and for "extra-package" connections 14 to pin grid PG1 of package PAC. In MCERD system A1, the intra-package connections convey information (e.g., such as configuration mode, configuration data, configuration enable) only during configuration mode. In addition to information-bearing connections, the intra-package connections provide for distribution of power, ground, and clock signals.

Each ERIC has one hundred I/O ports. Package PAC provides intra-package connections for eight of each hundred, and provides for extra-package connections for ninety-six of each hundred; four of each hundred are included in combination intra-package and extra-package connections. Package pin grid PG1 has two hundred eighty pins, all of which are coupled to at least one ERIC I/O port, while some of them are coupled to more than one. Motherboard socket MSK has two hundred pin sites. Daughterboard DBD provides physical and mechanical interfacing between package PAC and motherboard MBD by using a socket DSK with two hundred eighty pin sites and a pin grid with two hundred pins.

Pin grid PG1 is inserted into socket DSK. Daughterboard DBD provides connections between some of the pins of grid PG1 with pins of its own grid PG2 to define extra-package external connections. For example, connection 16 couples a pin of grid PG1 to a pin of grid PG2 that is coupled through socket MSK and motherboard MBD to a power supply VDD. Daughterboard also provides connections between pins of grid PG1 to define extra-package inter-ERIC connections. For example, connection 18 couples two pins of grid PG1 to provide an extra-package connection between ERIC ER1 and ERIC ER2. Other types of connections are also provided. For example, connection 20 is an extra-package intra-ERIC connection between two I/O ports of ERIC ER1. Connection 22 is a three-way extra-package inter-ERIC connection among ERICs ER1, ER2, and ER3. Connection 24 is a combination inter-ERIC connection and external connection.

Figure 2:
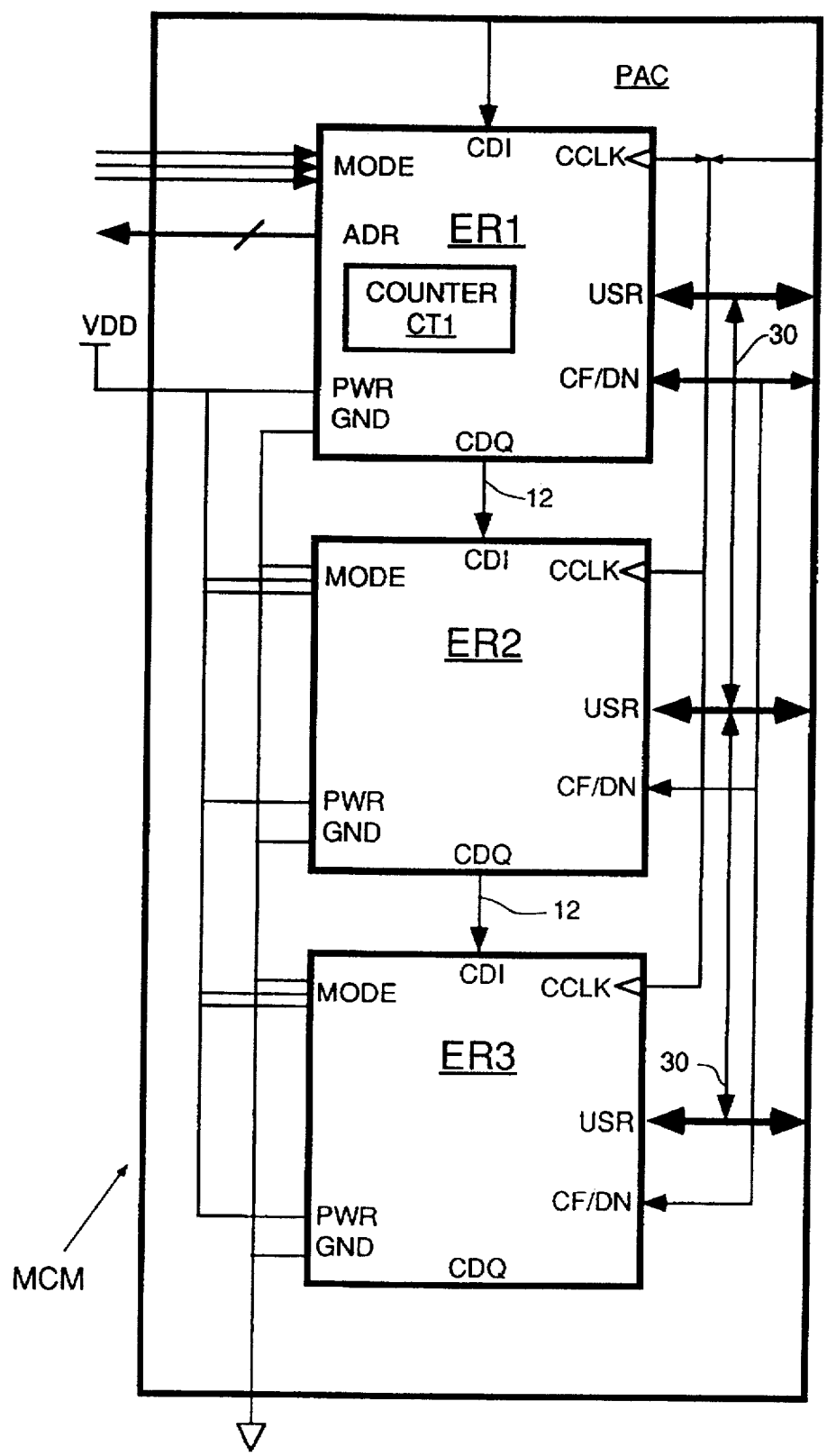
FIG. 2 is a schematic diagram of an MCERD of the system of FIG. 1.

Multi-chip module MCM is shown in greater detail in FIG. 2. Power VDD and ground GND are supplied to all ERICs ER1, ER2, and ER3. Each ERIC has three configuration inputs, collectively labeled "MODE" in FIG. 2. The voltages at these inputs determine the configuration mode of the ERIC. The basic modes are slave serial, master serial, and master parallel. In slave serial mode, ERIC ER1 serially inputs configuration data received at its configuration data input CDI with timing determined by a clock signal received at its clock input. In master serial mode, ERIC ER1 uses an internal clock to determine input timing; configuration data is received serially at configuration data input CDI. In master parallel mode, timing is generated by ERIC ER1, but configuration data is received in parallel over a set of dual-purpose lines and the user line group USR.

The configuration mode for ERICs ER2 and ER3 is preset to slave serial mode by hardwiring their configuration mode inputs MODE to power and ground as indicated in FIG. 2. The configuration mode for ERIC ER1 is determined by the connections of daughterboard DBD, which provides that the configuration mode is selectable by the host system. When ERIC ER1 is in slave configuration mode, an external clock signal is distributed to the clock inputs CCLK of all three ERICs. When ERIC ER1 is in a master configuration mode, it generates an internal clock that is transmitted from its CCLK input to the CCLK inputs of ERICs ER1 and ERR2.

Configuration occurs when host system A1 asserts the configuration/done ports CF/DN of ERICs ER1, ER2 and ER3. The configuration data stream sets a counter CT1 of ERIC ER1 with a count of the data number of configuration bits to be programmed into multi-chip module MCM. ERIC ER1 transmits addresses from its address output ADR to address an external memory (PROM or RAM) to request configuration data. As each bit is received, it is stored in ERIC ER1 until ERIC ER1 is full and configuration output CDQ is held low. Additional configuration data is overflowed out the configuration data output CDQ of ERIC ER1 to the configuration data input CDI of ERIC ER2. The first "1" bit indicates the start of data for ERIC ER2. Once ERIC ER2 is full, additional configuration data is overflowed out configuration data output CDQ of ERIC ER2 to the configuration data input CDI of ERIC ER3.

As each bit is stored in ERIC ER1 or passed to downstream ERIC ER2, counter CT1 decrements by one. Counter CT1 reaches zero when configuration is complete. When that occurs, ERIC ER1 attempts to send configuration/done port CF/DN low, indicating to the host system that configuration is complete. However, the host system can override ERIC ER1 and hold configuration/done port CF/DN high to continue or restart configuration.

Once configuration is complete, ERICS ER1, ER2, and ER3 enter operational mode. In operational mode, data enters and exits ERICs ER1, ER2, and ER3 via their USR ports. These user ports USR are predominantly coupled to package pins PG1. However, a relatively small number of intra-package connections can be provided for, as indicated by arrows 30.

Figure 3:
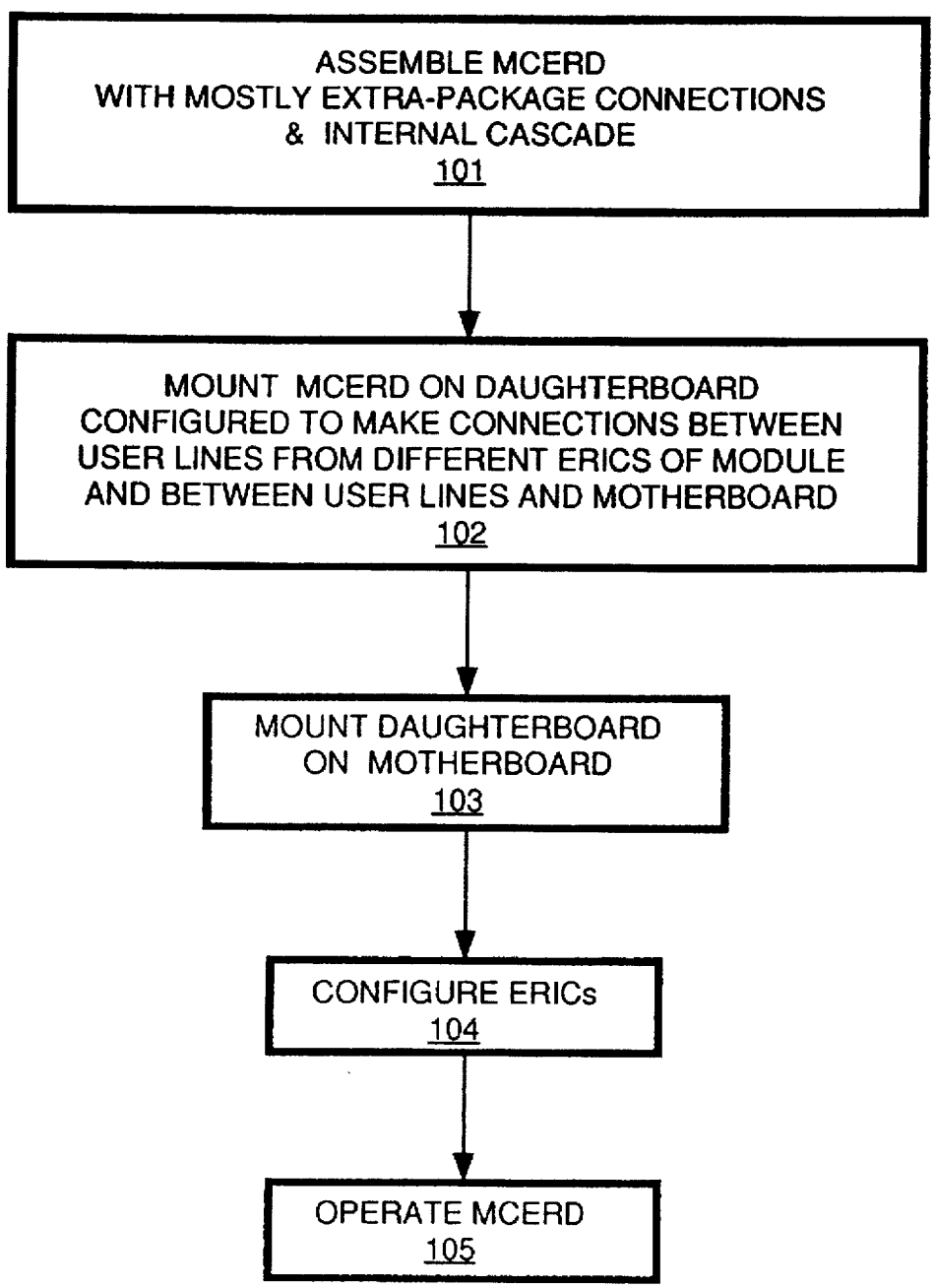
FIG. 3 is flow chart of a method in accordance with the present invention practiced in conjunction with the system of FIG. 1.

A method M1 of the present invention is flow-charted in FIG. 3. The multi-ERIC module is assembled at step 101. The module provides internal connections 12 for cascading configuration data. Most operational mode (user) ports are connected to package pins for extra-package access.

The multi-ERIC module MCM is mounted on a daughterboard DBD at step 102. Daughterboard DBD establishes extra-package inter-ERIC connections and provides for extra-package external connections by connecting some package pins PG1 to daughterboard pins PG2. Most of the inter-ERIC connections are made via daughterboard, rather than via package PAC.

Daughterboard DBD is attached to motherboard MBD at step 103. This establishes the external connections between the ERICs and the host system. These connection having been made, the host system can configure the ERICs at step 104. Once so configured, normal (non-configuration) operation of the ERICs can begin at step 105.

Multi-ERIC module MCM provides for data cascading in that data is first stored in ERIC ER1, overflowed to downstream ERIC ER2, and then overflowed to ERIC ER3. Alternatively, the present invention provides for enable-cascading. In this case, configuration data is broadcast to all ERICs (using a hybrid intra-package inter-chip and extra package external) connection. Initially, only a first ERIC is enabled for storing configuration data. When filled, it issues a done output that is received as a configuration enable signal by a downstream ERIC. When the second ERIC is configured, its done output serves to enable a next downstream ERIC. Thus, enable signals are cascaded. The lines along which the cascading enable signals travel are intra-package.

In the preferred embodiment, sockets DSK and MSK are provided for interchangeability. In many cases, it is not necessary to change inter-chip connections, so daughter-board exchanges are not required. In those cases, some cost savings can be achieved by omitting the zero-insertion-force daughterboard socket. Likewise, where the multi-ERIC module is to become a permanent part of the host computer, a zero-insertion-force socket need not be provided for the motherboard connection. In fact, in such a case, the motherboard can be designed to accommodate the multi-ERIC module directly, so that a separate daughterboard is not required. In that case, the extra-package inter-ERIC connections are made via the motherboard. These and other modifications to and variations upon the preferred embodiments are provided for by the present invention, the scope of which is limited only by the following claims.

What is claimed is:

1. An assembly comprising:

plural electrically reconfigurable integrated circuits, each of said electrically reconfigurable integrated circuits having plural input-output nodes; and a package for enclosing and providing interfacing for said electrically reconfigurable integrated circuits, said package including plural conductive interface elements for external interfacing of said electrically reconfigurable integrated circuits, said package providing intra-package connections between said electrically reconfigurable integrated circuits by electrically connecting predetermined respective ones of their input-output nodes to each other, said package providing for extra-package connections by electrically connecting predetermined ones of said input-output nodes to respective ones of said conductive interface elements, the number of said input-output nodes in said extra-package connections exceeding the number of said input-output nodes in said intra-package connections.

2. An assembly as recited in claim 1 wherein the number of said input-output nodes in said extra-package connections is at least an order of magnitude greater than the number of said input-output nodes in said intra-package connections.

3. An assembly as recited in claim 1 further comprising a circuit board on which said package is mounted, said circuit board providing inter-chip extra-package connections from at least some of said extra-package connections by electrically connecting pairs of said conductive elements, the number of said input-output nodes in said inter-chip extra-package connections exceeding the number of said input-output nodes in said intra-package connections.

4. An assembly as recited in claim 3 wherein said circuit board is a daughterboard for providing electrical and physical interfacing between said package and a host system including a motherboard so that at least some of said input-output nodes in said extra-package connections are connected to said host system.

5. An assembly as recited in claim 1 wherein said intra-package connections collectively include a series of cascade configuration connections that are successively activated during configuration of said electrically reconfigurable integrated circuits.

6. An assembly as recited in claim 5 wherein said electrically reconfigurable integrated circuits include configuration memory, said cascade configuration connections being arranged to provide configuration data for storage in said configuration memory.

7. An assembly as recited in claim 1 wherein each of said electrically configurable integrated circuits has alternative operating and configuration modes, said intra-package connections conveying information only during said configuration mode.

8. A method comprising the steps of:

assembling a module with a package having plural conductive interface elements and enclosing plural electrically reconfigurable integrated circuits, each with multiple input-output nodes, so that said package provides intra-package connections between pairs of said electrically reconfigurable integrated circuits by electrically connecting predetermined respective ones of their input-output nodes to each other, so that said package provides for extra-package connections by electrically connecting predetermined ones of said input-output nodes to respective ones of said conductive interface elements, and so that the number of said input-output nodes in said extra-package connections exceed the number of said input-output nodes in said intra-package connections.

9. A method as recited in claim 8 wherein said assembling step is performed so that the number of said input-output nodes in said extra-package connections is at least an order of magnitude greater than the number of said input-output nodes in said intra-package connections.

10. A method as recited in claim 8 further comprising a step of mounting said module on a circuit board that provides inter-chip extra-package connections from at least some of said extra-package connections by electrically connecting pairs of said conductive interface elements so that the number of said input-output nodes in said inter-chip extra-package connections exceeds the number of said input-output nodes in said intra-package connections.

11. A method as recited in claim 10 further comprising a step of mounting said circuit board on a motherboard of a host system so that at least some of said input-output nodes in said extra-package connections are electrically connected to said host-system.

12. A method as recited in claim 8 further comprising the steps of:

electrically configuring said electrically reconfigurable integrated circuits by supplying configuration data to said electrically configurable integrated circuits along at least one of said extra-package connections; and operating said electrically reconfigurable integrated circuits.

13. A method as recited in claim 8 wherein, in said electrically configuring step, said electrically reconfigurable integrated circuits are serially activated for configuration by transmitting signals along a series of cascade configuration connections of said intra-package connections.

* * * * *